US011239388B2

(12) United States Patent
Chen et al.

(10) Patent No.: US 11,239,388 B2
(45) Date of Patent: Feb. 1, 2022

(54) SEMICONDUCTOR DEVICE

(71) Applicant: EPISTAR CORPORATION, Hsinchu (TW)

(72) Inventors: Meng-Yang Chen, Hsinchu (TW); Jung-Jen Li, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 35 days.

(21) Appl. No.: 16/725,391

(22) Filed: Dec. 23, 2019

(65) Prior Publication Data

US 2020/0203570 A1 Jun. 25, 2020

(30) Foreign Application Priority Data

Dec. 24, 2018 (TW) .................. 107146841

(51) Int. Cl.
*H01L 33/18* (2010.01)
*H01L 33/22* (2010.01)
*H01L 33/30* (2010.01)
*H01L 33/38* (2010.01)
*H01L 33/50* (2010.01)
*H01L 33/56* (2010.01)
*H01L 33/62* (2010.01)
*H01L 33/40* (2010.01)

(52) U.S. Cl.
CPC ............ *H01L 33/18* (2013.01); *H01L 33/22* (2013.01); *H01L 33/30* (2013.01); *H01L 33/38* (2013.01); *H01L 33/405* (2013.01); *H01L 33/502* (2013.01); *H01L 33/56* (2013.01); *H01L 33/62* (2013.01); *H01L 2933/0091* (2013.01)

(58) Field of Classification Search
CPC ......... H01L 33/18; H01L 33/22; H01L 33/30; H01L 33/38; H01L 33/405; H01L 33/502; H01L 33/56; H01L 33/62; H01L 2933/0091
See application file for complete search history.

(56) References Cited

U.S. PATENT DOCUMENTS

| | | | |
|---|---|---|---|
| 5,048,036 A | 9/1991 | Scifres et al. | |
| 6,853,015 B2 | 2/2005 | Tsuchiya | |
| 7,126,160 B2 * | 10/2006 | Sun | H01S 5/183 257/98 |
| 8,772,801 B2 | 7/2014 | Inada et al. | |

(Continued)

OTHER PUBLICATIONS

Improved Light Extraction in AlGaInP-Based LEDs Using a Roughened Window Layer, Ray-Hua Horng et al 2008 J. Electrochem. Soc. 155 H710 (Year: 2008).*

*Primary Examiner* — Mark W Tornow
(74) *Attorney, Agent, or Firm* — Muncy, Geissler, Olds & Lowe, P.C.

(57) ABSTRACT

A semiconductor device includes a first type semiconductor structure, an active structure, and a contact layer. The first type semiconductor structure includes a first lattice constant, a first side and a second side opposite to the first side. The active structure is on the first side of the first type semiconductor structure and emits a radiation, and the radiation has a peak wavelength between 1000 nm and 2000 nm. The contact layer is on the second side of the first type semiconductor structure and includes a second lattice constant. A difference between the first lattice constant and the second lattice constant is at least 0.5%.

20 Claims, 9 Drawing Sheets

(56) References Cited

U.S. PATENT DOCUMENTS

| | | | |
|---|---|---|---|
| 2007/0238281 A1* | 10/2007 | Hudait | H01L 21/02381 438/604 |
| 2010/0224891 A1* | 9/2010 | Zhang | H01L 33/40 257/94 |
| 2013/0328082 A1* | 12/2013 | Zhu | H01L 33/04 257/98 |
| 2014/0117396 A1* | 5/2014 | Eisert | H01L 33/505 257/98 |
| 2016/0293764 A1* | 10/2016 | Ban | H01L 21/02381 |
| 2020/0006592 A1* | 1/2020 | Prineas | H01L 33/30 |

* cited by examiner

SEMICONDUCTOR DEVICE

CROSS REFERENCE TO RELATED APPLICATIONS

This application claims the right of priority based on TW Application Serial No. 107146841, filed on Dec. 24, 2018, and the content of which is hereby incorporated by reference in its entirety.

TECHNICAL FIELD

The application relates to a semiconductor device, and more particularly, to a semiconductor device including lattice constant differences.

DESCRIPTION OF BACKGROUND ART

Technology is changing with each passing day, and the semiconductor device plays a very important role in the fields of data transportation, energy conversion, and so on. The research and development of the related materials is ongoing. For example, the semiconductor material can apply in various optoelectronic devices, such as light emitting diode (LED), laser diode (LD), solar cell, power device, acoustic wave sensor, and so on. It can also be applied in the fields of illustration, display, communication, sensing, power system and so on.

The light emitting principle of the light-emitting diode is providing current to combine the electron in n type semiconductor layer and the hole in the p type semiconductor layer, in order to convert the electrical energy to optical energy. The advantages of the light-emitting diode is low power consumption and long lifetime, and the light-emitting diode therefore replaces the conventional light source and is widely used in traffic sign, back light module, various illumination and medical instrument, and so on. The light-emitting diode which emits near infrared light also has huge market potential in the fields of sensing system, recognition system, surveillance system and vehicle light source.

SUMMARY OF THE APPLICATION

A semiconductor device includes a first type semiconductor structure, an active structure, and a contact layer. The first type semiconductor structure includes a first lattice constant, a first side and a second side opposite to the first side. The active structure is on the first side of the first type semiconductor structure and emits a radiation, and the radiation has a peak wavelength between 1000 nm and 2000 nm. The contact layer is on the second side and includes a second lattice constant. A difference between the first lattice constant and the second lattice constant is at least 0.5%.

BRIEF DESCRIPTION OF THE DRAWINGS

The embodiments in the present disclosure will be explained according to the drawings. It should be noted that every layer or structure is only for exemplification and not drawn to scale. In fact, to clearly show the characters in the present disclosure, the sizes of the layers and structures can be arbitrarily enlarged or shrunk.

DETAILED DESCRIPTION OF PREFERRED EMBODIMENTS

Figure 1:
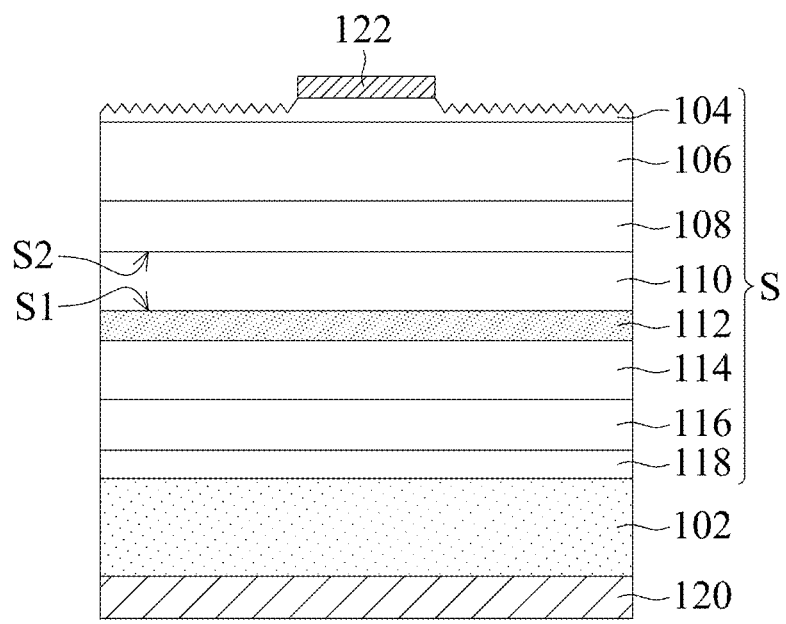
FIG. 1 shows a cross-sectional view of a semiconductor device in accordance with one embodiment of the present application.

Some embodiments are described below to make the person having ordinary skill in the art understand the present disclosure more easily. However, the embodiments are just for exemplification and not for limiting the scope of the present invention. It can be understood that the person having ordinary skill in the art can modify the following embodiments according to his requirement, for example, changing the order of processes and/or including more steps or less steps than the description.

Moreover, other structures or steps can be incorporated in the following embodiments. For example, the description of "forming a second layer/structure on the first layer/structure" can include the embodiment that the first layer/structure directly contacts the second layer/structure. It may include the embodiment that the first layer/structure indirectly contacts the second layer/structure, and other layer/structure exists between the first layer/structure and the second layer/structure. Besides, the spatial relative relationship between the first layer/structure and the second layer/structure may change according to the operation or usage of the device. On the other hand, different embodiments in the present disclosure may have repeated numbers and/or letters. The repetition is for simplification and clear and not for representing the relationship between different embodiments. Furthermore, in the present disclosure, the layer/structure with a description of "a layer/structure substantially consisting of X material" may still contain a dopant or unavoidable impurities.

In the embodiments of the present disclosure, if not described otherwise, the above-mentioned chemical formulas include "stoichiometric compounds" and "non-stoichiometric compounds". A "stoichiometric compound" is, for example, a compound in which the total number of atoms of III-group elements is the same as the total number of atoms of V-group elements. On the contrary, a "non-stoichiometric compound" is, for example, a compound in which the total number of atoms of III-group elements is different from the total number of atoms of V-group elements. For example, a compound has a chemical formula of AlGaAs represents that the compound includes Al and/or Ga as III-group elements, and As as V-group element, wherein the total number of atoms of the III-group elements (Al and/or Ga) and the total number of atoms of the V-group elements (As) may be the same or different.

In addition, if the above-mentioned compounds represented by the chemical formulas are stoichiometric compounds, then AlGaAs represents for $Al_{x1}Ga_{(1-x1)}As$, wherein $0<x1<1$; AlInP represents for $Al_{x2}In_{(1-x2)}P$, wherein $0<x2<1$; AlGaInP represents for $(Al_{y1}Ga_{(1-y1)})_{1-x3}In_{x3}P$, wherein $0<x3<1$, and $0<y1<1$; AlGaInAs represents for $(Al_{y2}Ga_{(1-y2)})_{1-x4}In_{x4}As$, wherein $0<x4<1$ 且 $0<y2<1$; AlGaN represents for $Al_{x5}Ga_{(1-x5)}N$, wherein $0<x5<1$; AlAsSb represents for $AlAs_{x6}Sb_{(1-x6)}$, wherein $0<x6<1$; InGaP represents for $In_{x7}Ga_{1-x7}P$, wherein $0<x7<1$; InGaAsP represents for $In_{x8}Ga_{1-x8}As_{1-y3}P_{y3}$, wherein $0<x8<1$, and $0<y3<1$; InGaAsN represents for $In_{x9}Ga_{1-x9}As_{1-y4}N_{y4}$, wherein $0<x9<1$, and $0<y4<1$; AlGaAsP represents for $Al_{x10}Ga_{1-x10}As_{1-y5}P_{y5}$, wherein $0<x10<1$, and $0<y5<1$; InGaAs represents for $In_{x11}Ga_{1-x11}As$, wherein $0<x11<1$.

For convenience, quaternary light emitting diode is used to be one of the embodiments of the semiconductor device in the present disclosure hereafter. However, the semiconductor device in the present invention is not limited to be quaternary light emitting diode. The present disclosure can be applied in different types of semiconductor device, such as binary light emitting diode, ternary light emitting diode or other semiconductor devices. Besides, two electrodes of the semiconductor device can locate on opposite sides or on the same side of the semiconductor device. "Quaternary", "ternary" and "binary" mentioned above represent the semiconductor stack of the light emitting diode includes a compound composed of four, three or two elements respectively.

Some embodiments of the semiconductor device in the present disclosure are described hereafter. The semiconductor device is particularly applicable to light emitting device which emits near-infrared ray (NIR). When the semiconductor device is a light-emitting diode, the material of the contact layer and/or the window layer close to light-emitting surface is a non-light-absorbing material. Since an absorbing wavelength of the non-light-absorbing material is different from a light emitting wavelength of the active structure, the non-light-absorbing material does not absorb the light emitted by the active structure. Therefore, the light-emitting efficiency can be enhanced. Moreover, the producing processes for manufacturing the light emitting device can be reduced since no extra process is needed to remove the contact layer. Besides, the contact layer and/or the window layer can be roughened to enhance the brightness of the semiconductor device. In some embodiments, the material of the active structure includes quaternary compound semiconductor, such as AlInGaAs or InGaAsP, and the non-light-absorbing material can include a binary compound semiconductor, such as GaAs or InP. In other embodiments, the active structure includes AlInGaAs. Preferably, the active structure is substantially consisting of AlInGaAs. In other embodiments, the active structure includes InGaAsP. Preferably, the active structure is substantially consisting of InGaAsP.

FIG. 1 shows a cross-sectional view of a semiconductor device 100 in accordance with one embodiment of the present disclosure. The semiconductor device 100 includes a base 102 and a semiconductor stack S on the base 102. The semiconductor stack S includes a first contact layer 104, a first window layer 106, a buffer layer 108, a first type semiconductor structure 110, an active structure 112, a second type semiconductor structure 114, a second window layer 116, and a second contact layer 118.

In some embodiments, the semiconductor stack S can epitaxially grow on the base 102 or bond to the base 102. That is, the base 102 can be a growth substrate or a non-growth substrate. The base 102 can be used to support the semiconductor stack S and other layer(s) or structure(s) disposed thereon. The base 102 can be transparent, semi-transparent or opaque to the light emitted by the active structure 112. The base 102 can be conductive, semiconductive, or insulative. In the embodiment, the semiconductor device 100 is vertical type, and the base 102 therefore includes a conductive material, such as metal material, metal alloy material, metal oxide material, semiconductor material or carbon-containing material. The metal material includes copper (Cu), aluminum (Al), chromium (Cr), tin (Sn), gold (Au), nickel (Ni), titanium (Ti), platinum (Pt), lead (Pb), zinc (Zn), cadmium (Cd), antimony (Sb) or cobalt (Co). The metal alloy includes the combination of the above metal elements. The semiconductor material includes IV group semiconductor or III-V group semiconductor, such as silicon (Si), germanium (Ge), silicon carbide (SiC), gallium nitride (GaN), gallium phosphide (GaP), gallium arsenide (GaAs), gallium arsenide phosphide (AsGaP) or indium phosphide (InP). The metal oxide material can include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO) or indium zinc oxide (IZO). The carbon-containing material can include diamond-like carbon (DLC) or graphene. In another embodiment, when the semiconductor device 100 is non-vertical type, the substrate can include insulating material, such as sapphire, glass, insulating nitride (ex: silicon nitride, SiN) or insulating oxide (ex: silicon oxide, $SiO_2$). In the embodiment, the semiconductor device 100 is a near infrared light-emitting device, and the material of the base 102 includes indium phosphide (InP) or gallium arsenide (GaAs). Preferably, the material of the base 102 is substantially consisting of InP or GaAs.

In this embodiment, the base 102 is a growth substrate and the second contact layer 118, the second window layer 116, the second type semiconductor structure 114, the active structure 112, the first type semiconductor structure 110, the buffer layer 108, the first window layer 106, and the first contact layer 104 can be sequentially formed on the base 102 by expitaxial growth method. The expitaxial growth method includes metal organic chemical vapor deposition (MOCVD), molecular beam epitaxy (MBE), hydride vapor deposition (HYPE) and the similar method or the combination of the above method.

In some embodiments, the material of the first contact layer 104, the first window layer 106, the first type semiconductor structure 110, the active structure 112, the second type semiconductor structure 114, the second window layer 116, and the second contact layer 118 can respectively include III-V group compound semiconductor material, such as AlGaInAs、AlGaAs、AlInAs、GaInAs、AlAs、GaAs、InAs、AlGaInP、AlGaP、AlInP、GaInP、AlP、GaP、InP、AlInGaN、AlInN、AlGaN、InGaN、AlAsSb、AlSb、AsSb、InGaAsP、InAsP、GaAsP、InGaAsN、InAsN、GaAsN、InN、AlGaAsP、AlAsP or other similar III-V group compound semiconductor material.

As shown in FIG. 1, the active structure 112 locates between the first type semiconductor structure 110 and the second type semiconductor structure 114. When the semiconductor device 100 is a light-emitting device, the first type semiconductor structure 110 and the second type semiconductor structure 114 can be cladding layers and/or confinement layers to provide electrons/holes and holes/electrons respectively, and their band gaps are higher than a band gap of the active structure 112 to increase the combination probability of electrons and holes in the active structure 112 to emit light. The active structure 112 can emit a radiation. For example, for the near infrared light-emitting device, the radiation has a peak wavelength between 1000 nm and 2000 nm, and preferably between 1200 nm and 1800 nm, preferably between 1250 nm and 1650 nm.

The semiconductor device 100 can include a single heterostructure (SH), a double heterostructure (DH), a double-side double heterostructure (DDH), or a multi-quantum well structure (MQW). In some embodiments, the active structure 112 is multi-quantum well structure and includes a plurality of barrier layers and a plurality of well layers alternately stacked. The barrier layer has a band gap than that of the well layer. In some embodiments, the barrier layers and the well layers can respectively include quaternary material or ternary material. In some embodiments, the active structure 112 can include aluminum (Al), gallium (Ga), indium (In), phosphor (P) or arsenide (As), and preferably the quaternary compound devoid of nitrogen element, such as AlGaInAs or InGaAsP.

As shown in FIG. 1, the first type semiconductor structure 110 and the second type semiconductor structure 114 locate on opposite sides of the active structure 112 respectively. The first type semiconductor structure 110 and the second type semiconductor structure 114 can be a single layer or multiple layers and include band gaps higher than the band gap of the active structure 112 for confining the carriers in the active structure 112 and effectively prevent the carriers overflow from the active structure 112, and/or respectively provides electrodes and holes into the active structure 112. In some embodiments, the first type semiconductor structure 110 and the second type semiconductor structure 114 can include III-V group semiconductor materials as shown above. In some embodiment, the first type semiconductor structure 110 and the second type semiconductor structure 114 preferably include aluminum (Al), gallium (Ga), indium (In), phosphor (P) or arsenide (As) or the combination of the above elements, and preferably the ternary compound or binary compound compound devoid of nitrogen element, such as InAlAs or InP.

In some embodiments, the first type semiconductor structure 110 has a first conductive type and the second type semiconductor structure 114 has a second conductive type different from the first conductive type. For example, the first conductive type and the second conductive type can be p type and n type respectively, or n type and p type respectively. The first type semiconductor structure 110 and the second type semiconductor structure 114 have different conductive types via adding different dopants. For example, the first type semiconductor structure 110 includes a dopant, and the second type semiconductor structure 114 includes another dopant different from the dopant in the first type semiconductor structure 110. More specifically, the dopants mentioned above can include magnesium (Mg), zinc (Zn), silicon (Si) or tellurium (Te). In some embodiments, the doping procedure in the first type semiconductor structure 110 and the second type semiconductor structure 114 can be performed by in-situ doping during epitaxial growth process and/or implanting p type dopant or n type dopant after epitaxial growth process. For example, in the embodiment, the dopant in the first type semiconductor structure 110 is zinc and the dopant in the second type semiconductor structure 114 is silicon.

In one embodiment, a doping concentration of the dopant in the first type semiconductor structure 110 or a doping concentration of the dopant in the second type semiconductor structure 114 can be between $1 \times 10^{16}/cm^3$ and $5 \times 10^{18}/cm^3$. In one embodiment, the doping concentration of the dopant in the first type semiconductor structure 110 can be higher than the doping concentration of the dopant in the second type semiconductor structure structure 114. For example, the doping concentration of the dopant in the first type semiconductor structure 110 is between $1 \times 10^{17}/cm^3$ and $1 \times 10^{18}/cm^3$, and more preferably between $3 \times 10^{17}/cm^3$ and $8 \times 10^{17}/cm^3$. The doping concentration of the dopant in the second type semiconductor structure 114 is between $3 \times 10^{16}/cm^3$ and $1 \times 10^{18}/cm^3$, and more preferably preferably between $5 \times 10^{16}/cm^3$ and $9 \times 10^{17}/cm^3$. In some embodiments, a thickness of the first type semiconductor structure 110 and a thickness of the second type semiconductor structure 114 can be respectively between 100 nm and 1200 nm, preferably between 200 nm and 1000 nm.

In the embodiment of the present disclosure, the first contact layer 104 and the first window layer 106 include the same non-light-absorbing material. The non-light-absorbing material can be GaAs. The first type semiconductor structure 110, the active structure 112, the second type semiconductor structure 114, the second window layer 116, and the second contact layer 118 can respectively include any suitable material, and the present disclosure is not for limit the material of the structures/layers. In other embodiment, the first contact layer 104 and the first window layer 106 can respectively include different non-light-absorbing materials, such as GaAs and InP. Moreover, the second contact layer 118 and the second window layer 116 can include the same or different non-light-absorbing materials. Or in other embodiment, the first contact layer 104, the first window layer 106, the second contact layer 118, and the second window layer 116 include non-light-absorbing materials, and those non-light-absorbing materials can be the same or different.

As shown in FIG. 1, the semiconductor device 100 includes the first contact layer 104 on the first type semiconductor structure 110, and the first type semiconductor structure 110 is between the first contact layer 104 and base 102. More specifically, the first type semiconductor structure 110 includes a first side S1 and a second side S2 opposite to the first side S1, and the second side S2 is farer away from the base 102 than the first side S1 to the base 102. The active structure 112 locates on the first sides S1 and the first contact layer 104 locates on the second side S2. A band gap of the first contact layer 104 is higher than a band gap of the active structure 112 and a band gap of the first type semiconductor structure 110 to prevent the efficiency of the semiconductor device 100 from decreasing because the first contact layer 104 absorbs light emitted from the active structure 112. In one embodiment, the difference between the band gap of the first contact layer 104 and the band gap of the active structure 112 is between 0.3 eV and 0.8 eV, and more preferably between 0.4 eV and 0.7 eV.

Moreover, the first type semiconductor structure 110 includes a first lattice constant and the first contact layer 104 includes a second lattice constant. The first lattice constant is different from the second lattice constant, that is, the first type semiconductor structure 110 and the first contact layer 104 are lattice mismatched. When the first type semiconductor structure 110 is composed of a layer, a lattice constant of the layer is defined as the first lattice constant. When the first type semiconductor structure 110 is composed of multiple layers, the mean value of the lattice constants of the multiple layers is defined as the first lattice constant. In some embodiments, the difference of the second lattice constant and the first lattice constant is at least 0.5%, preferably between 1% and 6%, and preferably between 2% and 5%, and more preferably between 3% and 4.5%. The difference D1 between the second lattice constant and the first lattice constant is calculated from the equation (1) listed below, wherein d1 represents the first lattice constant and d2 represents the the second lattice constant.

$$\text{Difference } D1=((d2-d1))/d2\times100\% \quad \text{equation (1)}$$

In the embodiment, the material of the first type semiconductor structure 110 includes $In_{0.53}Al_{0.47}As$ and the first lattice constant is 5.848. Preferably, the material of the first type semiconductor structure 110 is substantially consisting of $In_{0.53}Al_{0.47}As$. The material of the first contact layer 104 includes GaAs and the second lattice constant is 5.653. Preferably, the material of the first contact layer 104 is substantially consisting of GaAs. The difference of the second lattice constant and the first lattice constant is 3.45%. Moreover, the lattice constants can be acquired by any applicable methods. For example, the diffraction pattern acquired by transmission electron microscopy (TEM) can be used to analyze the lattice constants of the first type semiconductor structure 110 and the first contact layer 104, or the lattice constants can be determined by X-ray diffraction (XRD). In the present application, if not specifically mention, the term "lattice constant" means the lattice constant a0 of a substantially unstrained layer.

In one embodiment, a thickness of the first contact layer 104 can be between 5 nm and 100 nm, such as 50 nm. Besides, a surface of the first contact layer 104 can optionally include a roughing structure to decrease the probability of total reflection of the light emitted from the active structure 112 incurred in the semiconductor stack S. Therefore, the light extraction efficiency can be enhanced, and the brightness of the semiconductor device 100 can be further increased.

As shown in FIG. 1, the first window layer 106 is between the first contact layer 104 and the first type semiconductor structure 110. The first window layer 106 can increase the light extraction efficiency of the semiconductor device 100, and/or facilitate the current even spreading in the semiconductor stack S. In one embodiment, the first window window layer 106 and the first contact layer 104 include the same material. Therefore, the first window layer 106 and the first contact layer 104 includes the same lattice constant (both of them are second lattice constant), and the difference between the second lattice constant and the first lattice constant of the first type semiconductor structure 110 is at least 0.5%. For example, the material of the first contact layer 104 and the first window layer 106 both include GaAs. Preferably, the material of the first contact layer 104 and the first window layer layer 106 are substantially consisting of GaAs. In other embodiment, the first contact layer 104 and the first window layer 106 include different materials, and the window layer 106 includes a lattice constant. The difference of the lattice constant of the window layer 106 and the first lattice constant is lower than 0.5%. In other embodiment, the material of the first window layer 106 can be the same as that of the base 102. For example, the first contact layer 104 includes GaAs and the first window layer 104 and the base 102 both include InP. Preferably, the first contact layer 104 is substantially consisting of GaAs and the first window layer 104 and the base 102 are substantially consisting of InP.

Besides, the conductive types of the first contact layer 104 and the first window layer 106 can be the same as that of the first type semiconductor structure 110. For example, the conductive types of the first contact layer 104, the first window layer 106, and the first type semiconductor structure 110 are p type, and the first contact layer 104, the first window layer 106 and the first type semiconductor structure 110 includes the same dopant, such as zinc. The doping procedure in the first contact layer 104 and the first window layer 106 can be conducted by in-situ doping during epitaxial growth process and/or implanting dopants after epitaxial growth process. The doping concentration of the dopant in the first contact layer 104 is higher than the doping concentration of the dopant in the first type semiconductor structure 110, and the doping concentration of the dopant in the first contact layer 104 is higher than $1\times10^{18}/cm^3$ to have a lower electrical resistance between the first contact layer 104 and the electrode structure thereon. The doping concentration of the dopant in the first contact layer 104 is preferably between $2\times10^{18}/cm^3$ and $5\times10^{19}/cm^3$, for example. The first window layer 106 includes a thicker thickness or/and smaller doping concentration than that of the first type semiconductor structure 110, in order to increase the light extraction efficiency or improve the lateral current spreading ability.

The doping concentration of the dopant in the first contact layer 104 is different from the doping concentration of the dopant in the first window layer 106. In some embodiments, the doping concentration of the dopant in the first window layer 106 is lower than that in the first contact layer 104. In one embodiment, the doping concentration of the dopant in the first contact layer 104 is between $2\times10^{16}/cm^3$ and $1\times10^{19}/cm^3$, preferably between $4\times10^{16}/cm^3$ and $8\times10^{18}/cm^3$.

In some embodiments, a thickness of the first window layer 106 can be thicker than a thickness of the first contact layer 104. In one embodiment, the thickness of the first window layer 106 can be between 300 nm and 10000 nm, and preferable between 500 nm and 8000 nm. In the embodiment, the thickness of the first window layer 106 is 7000 nm.

As shown in FIG. 1, a buffer layer 108 locates between the first window layer 106 and the first type semiconductor structure 110 to moderate the energy level difference between the first type semiconductor structure 110 and the first window layer 106. More specifically, a valence band energy (Ev) difference exists between a valence band level of the first window layer 106 and a valence band level of the first type semiconductor structure 110, and a conduction band energy (Ec) difference exists between a conduction band level of the first window layer 106 and a conduction band level of the first type semiconductor structure 110. When the valence band energy difference and/or the conduction band energy difference are/is too large, an additional voltage is needed for the carriers to flow, which results in a higher forward voltage (Vf) and smaller saturation current of the semiconductor device 100 or cause failure of the semiconductor device 100 ahead of time. Therefore, the buffer layer 108 between the first window layer 106 and the first type semiconductor structure 110 can avoid the problems mentioned above. The buffer layer 108 includes a valence band level between that of the first type semiconductor structure 110 and that of the first window layer 106. The buffer layer 108 further includes a conduction band level between that of the first type semiconductor structure 110 and that of the first window layer 106. Therefore, the energy level difference between the first type semiconductor structure 110 and the first window layer 106 can be moderated, and the reliability of the semiconductor device 100 can be improved. In another embodiment, the window layer 106 can be optionally incorporated into the semiconductor device 100. When the semiconductor device 100 does not include the first window layer 106, the buffer layer 108 is between the first contact layer 104 and the first type semiconductor structure 110, and the buffer layer 108 directly contacts the first contact layer 104 and the first type semiconductor structure 110. As mentioned above, the buffer layer 108 is able to moderate the energy level difference between the first contact layer 104 and first type semiconductor structure 110.

In one embodiment, the material of the buffer layer 108 can include quaternary semiconductor compound, such as AlGaInAs or InGaAsP. When the first contact layer 104 includes GaAs and the first type semiconductor structure 110 includes InAlAs, the material of the buffer layer includes $(Al_xGa_{1-x})_{0.47}In_{0.53}As$, wherein $0<x<1$. Preferably, when the first contact layer 104 is substantially consisting of GaAs and the first type semiconductor structure 110 is substantially consisting of InAlAs, the material of the buffer layer is substantially consisting of $(Al_xGa_{1-x})_{0.47}In_{0.53}As$, wherein $0<x<1$. In another embodiment, when the first contact layer 104 includes GaAs and the first type semiconductor structure 110 includes InP, the material of the buffer layer includes InGaAsP. Preferably, when the first contact layer 104 is substantially consisting of GaAs and the first type semiconductor structure 110 is substantially consisting of InP, the material of the buffer layer is substantially consisting of InGaAsP.

When the buffer layer 108 locates between the first type semiconductor structure 110 and the first window layer 106 (or the first contact layer 104), the buffer layer 108, the first type semiconductor structure 110 and the first window layer 106 (or the first contact layer 104) have the same conductive type, and all of them can include the same dopant. In one embodiment, the doping concentration of the dopant in the buffer layer 108 can be between $5\times10^{16}/cm^3$ and $2\times10^{18}/cm^3$, preferably between $5\times10^{17}/cm^3$ and $1\times10^{18}/cm^3$. Besides, the thickness of the buffer layer 108 can be 10 nm and 200 nm, such as 100 nm.

In some embodiments, the semiconductor device 100 can be devoid of the buffer layer 108 so the window layer 106 directly contact the first type semiconductor structure 110. In addition, the position and the amount of the buffer layer 108 can be adjusted based on the desired character of the actual products. In other embodiment, the semiconductor device 100 can include two or more buffer layers having the same or different material and/or doping concentration. For example, in some embodiments, an additional buffer layer (not shown) locates between the second type semiconductor structure 114 and the second window layer 116.

As shown in FIG. 1, the second window layer 116 is between the second type semiconductor structure 114 and base 102, and the second window layer 116 is far from the second side S2 of the first type semiconductor structure 110. In some embodiments, the material of the second window layer 116 can include III-V group semiconductor material. In some embodiments, the second window layer 116 can include transparent conductive material. material. For example, the material of the second window layer 116 can include metal oxide material or semiconductor material. The metal oxide material can include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), magnesium oxide (MgO) or indium zinc oxide (IZO). The semiconductor material can be indium phosphide (InP), gallium arsenide (GaAs), aluminum gallium arsenide (AlGaAs) or gallium phosphide (GaP). The material of the first window layer 106 can refer to the material of the second window layer 116. In one embodiment, the material of the second window layer 116 and the material of the first window layer 106 include the same, such as InP. Preferably, the material of the second window layer 116 and the material of the first window layer 106 are substantially consisting of InP. In other embodiment, the material of the second window layer 116 and the material of the first window layer 106 are different, and include InP and GaAs respectively. Preferably, the material of the second window layer 116 and the material of the first window layer 106 are substantially consisting of InP and GaAs respectively.

The second window layer 116 has a third lattice constant different from the second lattice constant of the first contact layer 104. In some embodiments, the difference between the third lattice constant and the second lattice constant is at least 5%, such as between 1% and 6%, and preferably 2% and 5%, and more preferably 3% and 4.5%. The third lattice constant of the second window layer 116 can be acquired by any applicable methods as mentioned previously. In some embodiments, the difference between the third lattice constant and the first lattice constant is not greater than 0.5%. In other embodiment, the difference between the third lattice constant and the first lattice constant is less than 0.2% and larger than 0. The difference D2 between the third lattice constant and the first constant is calculated from the equation (2) listed below, wherein d1 represents the first lattice constant and d3 represents the third lattice constant.

$$\text{Difference } D2=((d3-d1))/d3\times100\% \qquad \text{equation (2)}$$

In one embodiment, the doping concentration of the dopant in the second window layer 116 can be higher than $1\times10^{16}/cm^3$, such as between $2\times10^{16}/cm^3$ and $1\times10^{18}/cm^3$. In some embodiments, the thickness of the second window layer 116 can be smaller than that of the first window layer 106. In other embodiment, the thickness of the second window layer 116 is thicker than that of the second type semiconductor structure 114, or the doping concentration in the second window layer 116 is lower than that in the second type semiconductor structure 114, in order to increase the light extraction efficiency or improve the lateral current spreading ability. In some embodiments, the thickness of the second window layer 116 can be between 100 nm and 1000 nm, such as 500 nm.

As shown in FIG. 1, the second contact layer 118 can optionally locate between the second window layer 116 and the base 102, and the second contact layer 118 is far away from the second side S2 of the first type semiconductor structure 110. The second contact layer 118 can include III-V group semiconductor material as mentioned previously. The conductive types of the second contact layer 118 and the second window layer 116 are the same as that of the second type semiconductor structure 114. For example, the conductive types of the second contact layer 118 and the second window layer 116 are the same as that of the second type semiconductor structure 114. For example, the conductive types of the second contact layer 118, the second window layer 116, and the second type semiconductor structure 114 are all n type and include the same dopant such as silicon. The doping concentration of the dopant in the second contact layer 118 is different from that in the second window layer 116. In some embodiments, the doping concentration of the dopant in the second contact layer 118 is higher than that in the second window layer 116. In one embodiment, the doping concentration of the dopant in the second contact layer 118 can be higher than $5\times10^{17}/cm^3$ to have lower electrical resistance between the second contact layer 118 and the base 102. The doping concentration of the dopant in the second contact layer 118 is between $1\times10^{18}/cm^3$ and $1\times10^{20}/cm^3$, for example.

The semiconductor device 100 includes a first electrode 122 and a second electrode 120 on the opposite sides of the semiconductor device 100 respectively. For example, in the embodiment, the first contact layer 104 locates between the first type semiconductor structure 110 and the first electrode 122, and the base 102 locates between the second electrode 120 and the second type semiconductor structure 114 to form a vertical type semiconductor device 100. The present disclosure is not limited to the vertical type semiconductor device 100, in other embodiment, the first electrode 122 and the second electrode 120 can locate on the same side of the base 102 to form a horizontal type semiconductor device. In one embodiment, the first contact layer 104 is between the first type semiconductor structure 110 and the first electrode 122 and only aligned to the first electrode 122.

Both of the first electrode 122 and the second electrode 120 can be used to connect the outer power source and conduct the current into the semiconductor device 100. In some embodiments, the materials of the first electrode 122 and the second electrode 120 can respectively include metal material, alloy material, metal oxide material or carbon-containing material. For example, the metal material can include aluminum (Al), chromium (Cr), copper (Cu), tin (Sn), gold (Au), nickel (Ni), titanium (Ti), platinum (Pt), lead (Pb), zinc (Zn), cadmium (Cd), antimony (Sb) or cobalt (Co). The alloy material includes includes the combination of the above metal elements. The metal oxide material can include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO) or indium zinc oxide (IZO). The carbon-containing material can include diamond-like carbon (DLC) or graphene.

Figure 2:
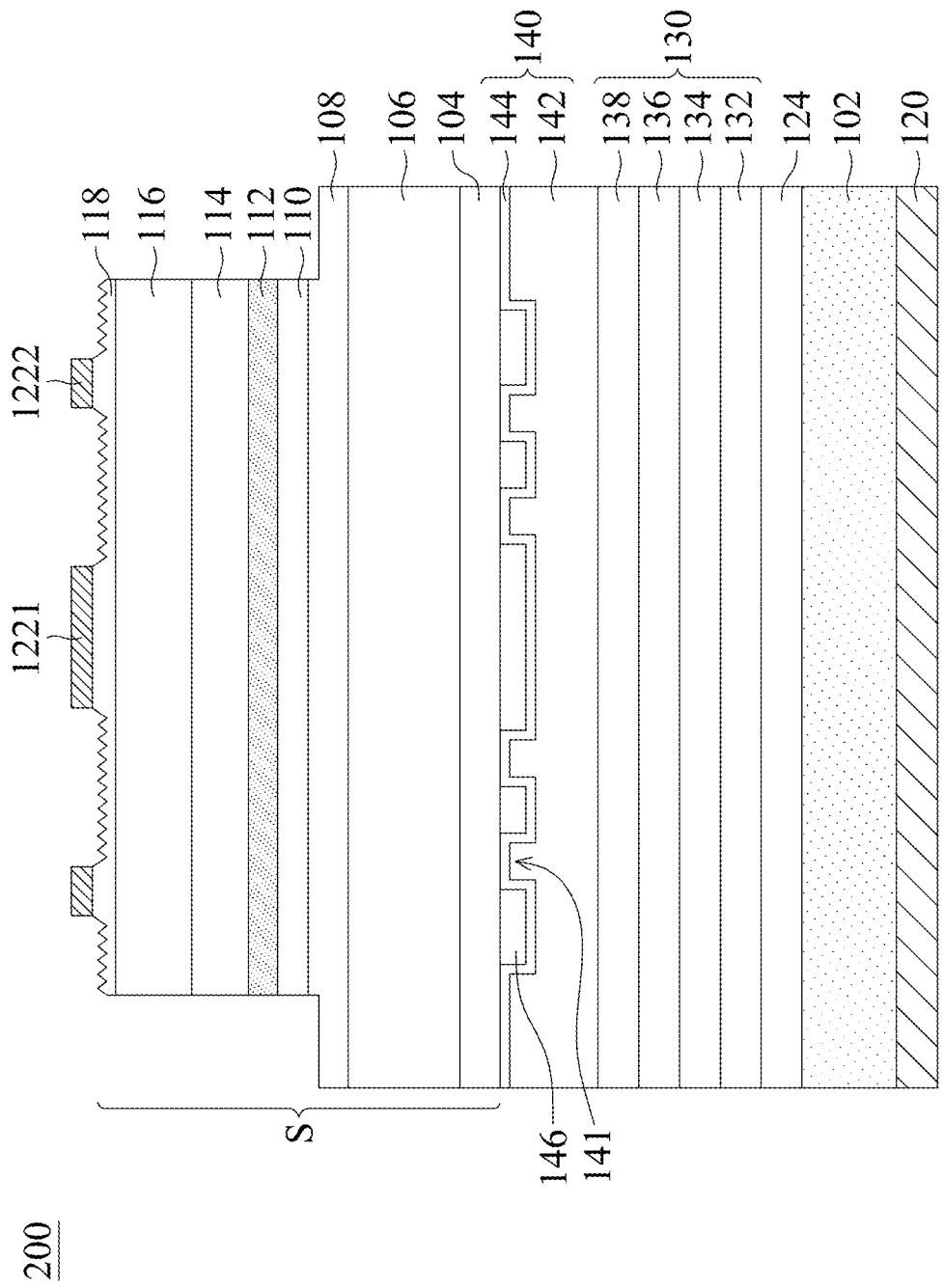
FIG. 2 shows a cross-sectional view of the semiconductor device in accordance with one embodiment of the present application.
Figure 3:
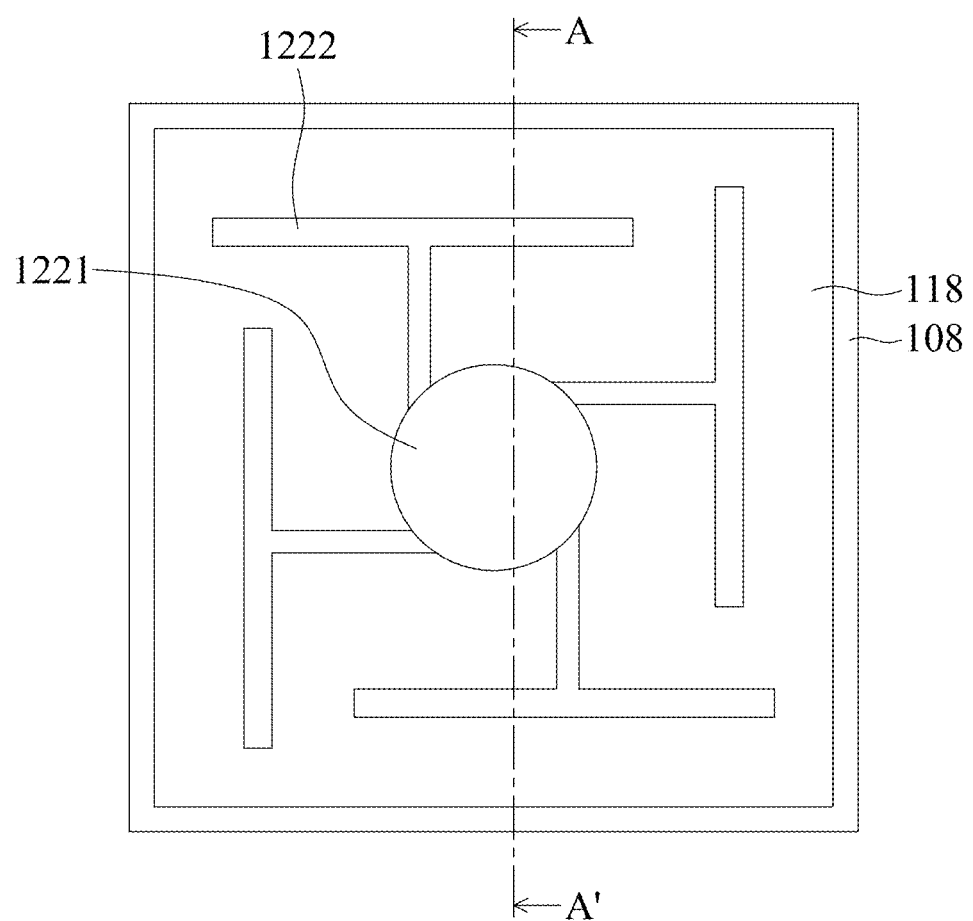
FIG. 3 shows a top view of a semiconductor device in accordance with one embodiment of the present application.

FIG. 2 shows a cross-sectional view of the semiconductor device 200 in accordance with one embodiment of the present disclosure. FIG. 3 shows a top view of a semiconductor device 200 in accordance with one embodiment of the present disclosure. FIG. 2 is the cross-sectional view of the semiconductor device 200 taken along line AA' in FIG. 3. The layer/structure having the reference numerals in FIG. 2 identical to those shown in FIG. 1 represents the same as those in FIG. 1. The materials and the characters are described above and omitted herein for brevity. Compared to the semiconductor device 100 shown in FIG. 1, the structures of the semiconductor stack S in the semiconductor device 200 is in a reverse order because of a wafer bonding process and the first type semiconductor structure 110 locates between the base 102 and the active structure 112. In this embodiment, the base 102 is a non-growth substrate. Furthermore, after the wafer bonding process, the second contact layer 118 and the second window layer 116 locate at the path of light emitted from the active structure 112. Therefore, the second contact layer 118 and the second window layer 116 can also be made of non-light-absorbing material, and the band gaps of the second contact layer 118 and the second window layer 116 are higher than the band gap of the active structure 112. For example, InP is used as the non-light-absorbing material. The wafer bonding process will be described below.

Compared to the semiconductor device 100 shown in FIG. 1, besides the base 102, the semiconductor stack S, the first electrode 122 and the second electrode 120, the semiconductor device 200 further includes a reflective structure 130, a conductive structure 140, and a bonding layer 124 between the base 102 and semiconductor stack S. Moreover, in the embodiment, the first contact layer 104 can be optionally omitted. The characteristics of the second contact layer 118, the second window layer 116, and the second type semiconductor structure 114 can correspond to those of the first contact layer 104, the first window layer 106, and the first type semiconductor structure 110, respectively. For example, the characteristics include lattice constant, doping concentration or thickness. In addition, the energy gap differences among the second contact layer 118, the second window layer 116, and the second type semiconductor structure 114 can also correspond to those among the first contact layer 104, the first window layer 106, and the first type semiconductor structure 110. In the embodiment, as shown in FIGS. 2~3, the second electrode 122 includes an electrode pad 1221 approximately located on the center of a top surface of the semiconductor stack S, and multiple extending electrodes 1222 connected to the electrode pad 1221 and extending to the direction away from the electrode pad 1221. The multiple extending electrodes 1222 can spread the current into the semiconductor stack S uniformly.

More specifically, the semiconductor device 200 includes a bonding layer 124 between the reflective structure 130 and the base 102 to connect the reflective structure 130 with the base 102. In some embodiments, the bonding layer 124 includes a plurality of sub-layers (not shown), and the material of the bonding layer 124 can include electrically conductive material, such as metal oxide material, semiconductor material, metal material, metal alloy material, or carbon-containing material. The metal oxide material can include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), indium cerium oxide (ICO), indium titanium oxide (ITiO), indium zinc oxide (IZO), indium gallium oxide (IGO) or gallium and aluminum co-doped zinc oxide (GAZO). The semiconductor material can include gallium phosphide (GaP). The metal material can include copper (Cu), aluminum (Al), tin (Sn), gold (Au), silver (Ag), nickel (Ni), titanium (Ti), platinum (Pt), lead (Pb) or tungsten (W). The metal alloy includes the combination of the above metal elements. The carbon-containing material can include graphene.

The reflective structure 130 locates between the base 102 and the semiconductor stack S to reflect the light emitted from the active structure 112 for increasing the light extraction efficiency (LEE) of the semiconductor device 200. In some embodiments, the material of the reflective structure 130 can include metal material or metal alloy material. The metal material can include copper (Cu), aluminum (Al), tin (Sn), gold (Au), silver (Ag), platinum (Pt) or tungsten (W). The metal alloy includes the combination of the above metal elements.

In some embodiments, as shown in FIG. 2, the reflective structure 130 can include a third contact layer 132, a barrier layer 134 on the third contact layer 132, a reflective connecting layer 136 on the barrier layer 134, and a reflective layer 138 on the reflective connecting layer 136. The third contact layer 132 contacts the bonding layer 124 to form a low electrical contact resistance therebetween. The barrier layer 134 can prevent the material of the bonding layer 124 from diffusing into the reflective layer 138 during the manufacturing process which damages the reflective layer 138, therefore, the reflectance of the reflective layer 138 can be remained. The reflective connecting layer 136 can connect the reflective layer 138 and the barrier layer 134. The reflective layer 138 can reflect the light emitted from the active structure 112. In another embodiment, the reflective structure 130 can include more layers. The materials of the third contact layer 132, the barrier layer 134, the reflective connecting layer 136, and the reflective layer 138 can respectively include the same or different metal material or metal alloy material. The metal material can include copper (Cu), (Cu), aluminum (Al), tin (Sn), gold (Au), silver (Ag), nickel (Ni), titanium (Ti), platinum (Pt), lead (Pb) or tungsten (W). The metal alloy material includes the combination of the above metal material.

The conductive structure 140 locates between the reflective structure 130 and the first contact layer 104. The conductive structure 140 is transparent to the light emitted from the active structure 112 and used to facilitate the current conduction and spreading between the first contact layer 104 and the reflective structure 130. In some embodiments, the conductive structure 140 and the reflective structure 130 can cooperatively form Omni-Directional Reflector (ODR) to further improve the light extraction efficiency (LEE) of the semiconductor device 200. In some embodiments, the material of the conductive structure 140 can include metal oxide material, the carbon-containing material or the combination of the above material. The metal oxide material can include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), indium cerium oxide (ICO), indium titanium oxide (ITiO), indium zinc oxide (IZO), indium gallium oxide (IGO) or gallium and aluminum co-doped zinc oxide (GAZO). The carbon-containing material can include graphene.

In some embodiments, as shown in FIG. 2, the conductive structure 140 includes a first conductive layer 142 on the reflective structure 130 and a second conductive layer 144 between the semiconductor stack S and the first conductive layer 142. In some embodiments, the material of the first conductive layer 142 is different from the material of the second conductive layer 144. More specifically, at least one element of the material of the first conductive layer 142 is different from the material of the second conductive layer 144. For example, the material of the first conductive layer 142 is indium zinc oxide (IZO) and the material of the second conductive layer 144 is indium tin oxide (ITO).

In some embodiments, as shown in FIG. 2, an insulating layer 146 locates between the second conductive layer 144 and the first contact layer 104, and directly contacts the second conductive layer 144. In some embodiments, the material of the insulating layer 146 can have the transmittance higher than 90% to the light emitted from the active structure 112, and the material of the insulating layer 146 can include insulating oxide material or insulating non-oxide material. The insulating oxide material can include silicon oxide (SiOx) or the similarities. The insulating non-oxide material can include silicon nitride (SiNx), benzocyclobutene (BCB), cyclo olefin copolymer (COC) or fluorocarbon polymer. In other embodiment, the material of the insulating layer 146 can include halide or the compound of IIA element and VII group element, such as calcium fluoride (CaF$_2$) or magnesium fluoride (MgF$_2$). In one embodiment, the material of the insulating layer 146 has a refractive index less than 1.6.

In some embodiments, the insulating layer 146 can include a plurality of holes passing through the insulating layer 146, so that the conductive structure 140 directly contacts and connects electrically to the semiconductor stack S through the plurality of holes.

In some embodiments, as shown in FIG. 2, the top surface(s) of the second contact layer 118 and/or the second window layer 116 can be roughened to scatter the light emitted from the active structure 112 for increasing the light extraction efficiency of the semiconductor device 200.

Figure 4A:
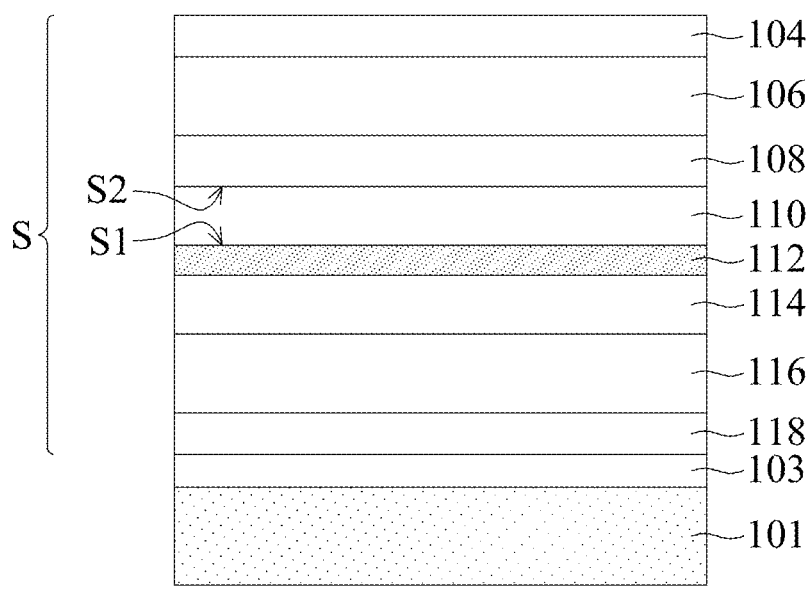
FIGS. 4A~4B show cross-sectional views of different steps when producing the semiconductor device in accordance with the embodiment of the present application shown in FIG. 2.
Figure 4B:
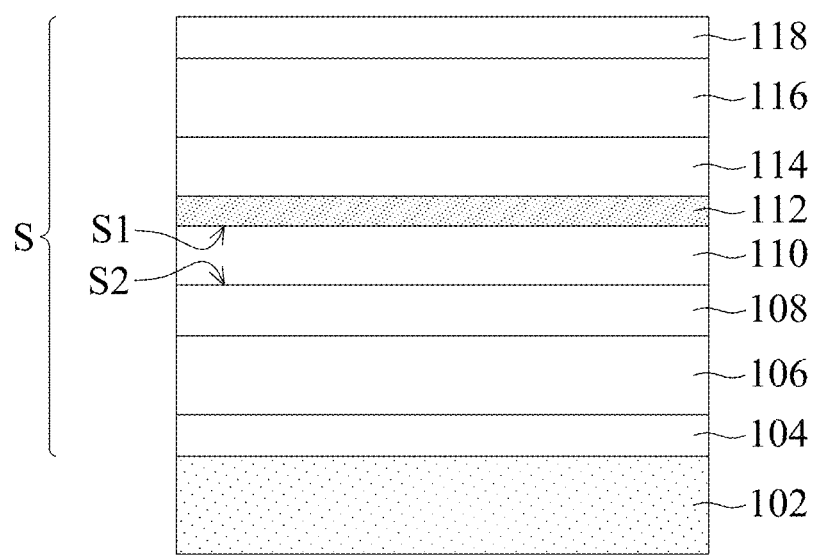

FIGS. 4A~4B show cross-sectional views of different steps when manufacturing the semiconductor device in accordance with the embodiment of the present disclosure for describing the wafer bonding process, wherein the base 102 is a non-growth substrate. As shown in FIG. 4A, the semiconductor stack S grows epitaxially on a growth substrate 101. A sacrificial layer 103 can be optionally located between the semiconductor stack S and the growth substrate 101. The sacrificial layer 103 can be removed in the following step as shown in FIG. 4B, and the first contact layer 104, the first window layer 106, the buffer layer 108, the first type semiconductor structure 110, the active structure 112, the second type semiconductor structure 114, the second window layer 116 and the second contact layer 118 can be separated from the growth substrate 101. In some embodiments, the sacrificial layer 103 can be formed on the growth substrate 101 before forming the second contact layer 118. In some embodiments, the semiconductor device does not include the sacrificial layer 103, and the second contact layer 118 grows directly on the growth substrate 101. In other embodiment, a buffer structure (not shown) locates between the second contact layer 118 and the growth substrate 101 for decreasing the lattice defects in the second contact layer 118 and the layers thereon so the epitaxial quality of the semiconductor stack S can be improved. In other embodiment, the semiconductor device is devoid of the sacrificial layer 103 but includes an etching stop layer (not shown) between the growth substrate 101 and the second contact layer 118. The etching stop layer can protect the semiconductor stack S from destroying when removing the growth substrate 101 by etching. The material of the etching stop layer can include InGaAs or InGaP. Preferably, the material of the etching stop layer is substantially consisting of InGaAs or InGaP.

Moreover, in some embodiments, the sacrificial layer 103 includes a material having an etch selectivity different from that of the material of the second contact layer 118. For example, the material of the sacrificial layer 103 is aluminum arsenide (AlAs). In some embodiments, the sacrificial layer 103 can be removed by wet etching process, dry etching process, laser lift-off (LLO) process or the combination of the processes mentioned above.

FIG. 4B shows a cross-sectional view of one of the steps when manufacturing the semiconductor device in accordance with the embodiment of the present disclosure. Through the wafer bonding process (or the substrate transfer technique), the first contact layer 104, the first window layer 106, the buffer layer 108, the first type semiconductor structure 110, the active structure 112, the second type semiconductor structure 114, the second window layer 116 and the second contact layer 118 connect to the non-growth substrate (base 102) by an bonding layer (not shown). The bonding layer locates between the first contact layer 104 and the non-growth substrate. Then, the sacrificial layer 103 is removed to separate the second contact layer 118 from the growth substrate 101. The order of the first contact layer 104, the first window layer 106, the buffer layer 108, the first type semiconductor structure 110, the active structure 112, the second type semiconductor structure 114, the second window layer 116, and the second contact layer 118 on the non-growth substrate is opposite to that on the growth substrate 101 in FIG. 4A due to the up-side-down transfer process. More specifically, before the up-side-down transfer process, the active structure 112 locates between the first type semiconductor structure 110 and the growth substrate 101 as shown in FIG. 4A. After the up-side-down transfer step, the first type semiconductor structure 110 locates between the non-growth substrate and the active structure 112 as shown in FIG. 4B.

Moreover, the growth substrate 101 can include semiconductor material, such as silicon carbide (SiC), gallium arsenide (GaAs), gallium phosphide (GaP), gallium arsenide phosphide (GaAsP), zinc selenide (ZnSe) or indium phosphide (InP). In some embodiments, the material of the growth substrate 101 can include sapphire. The materials of the non-growth substrate and the growth substrate 101 can be the same or different. In some embodiments, the non-growth substrate has different characteristic from that of the growth substrate 101, for example, the non-growth substrate has higher thermal conductivity, electrical conductivity, transparency or mechanical strength than the growth substrate 101.

Figure 5:
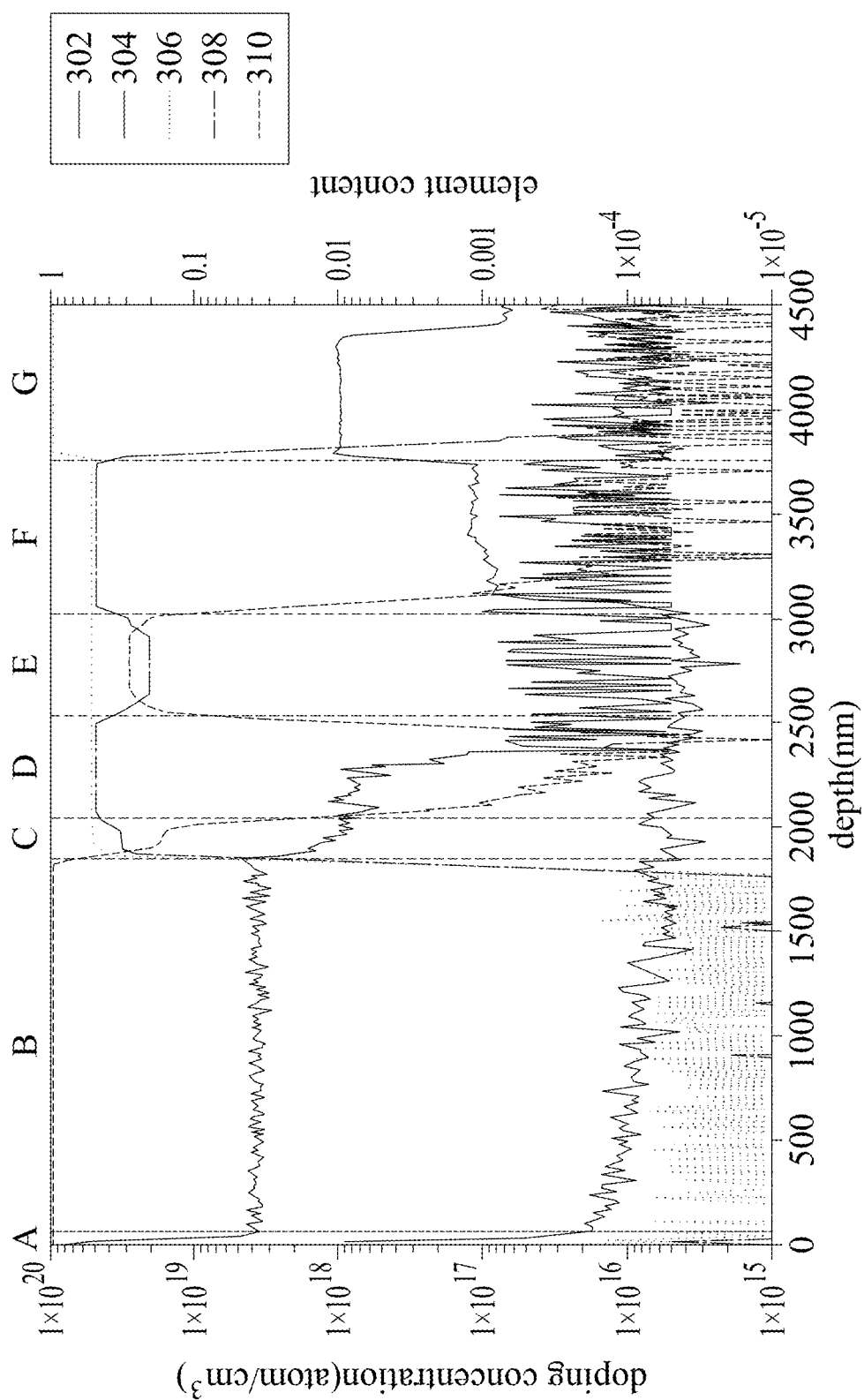
FIG. 5 is a graph showing the relationship between the element concentration and the depth of a part of the semiconductor device in accordance with one embodiment of the present application.

FIG. 5 is a graph showing the relationship between the element concentration and the depth of a part of the semiconductor device in accordance with one embodiment of the present disclosure. More specifically, FIG. 5 is a mass spectrum of a partial structure of the semiconductor device 100 measured by secondary ion mass spectrometer (SIMS). Other technique can also be used to obtain the relationship between the element concentration and the depth of a part of the semiconductor device. The "depth" is defined as a distance measuring in a direction from the side away from the base 102 toward the side close to the base 102, that is, the deeper the depth, the closer to the substrate is.

As shown in FIG. 5, according to the depths and the orders of layers in the semiconductor device 100, the mass spectrum can be divided into seven regions A~G. The region A is the position corresponding approximately to the first contact layer 104. The region B is corresponding approximately to the first window layer 106. The region C is corresponding approximately to the buffer layer 108. The region D is corresponding approximately to the first type semiconductor structure 110. The region E is corresponding approximately to the active structure 112. The region F is corresponding approximately to the second type semiconductor structure 114. The region G is corresponding approximately to the second window layer 116.

As shown in FIG. 5, the mass spectrum includes a first dopant 302, a second dopant 304, a first element 306, a second element 308 and a third element 310. The first contact layer 104, the first window layer 106, the buffer layer 108 and the first type semiconductor structure 110 include the first dopant 302, which makes the conductivity types of the layers mentioned above p-type. The first dopant is zinc (Zn). The second type semiconductor structure 114 and the second window layer 116 include the second dopant 304 which makes the conductivity types of the layers mentioned above n-type. The second dopant is silicon (Si). The first element 306, the second element 308, and the third element 310 which which can be III-group element or V-group element are the host elements (main composition) in the respective layer. In FIG. 5, the first element 306 is indium, the second element 308 is aluminum, and the third element 310 is gallium, which are all III-group element. The atomic mass of the first element 306 is larger than that of the third element 310, and the atomic mass of the second element 308 is smaller than that of the third element 310. The left vertical axis indicates the concentrations of the first dopant 302, and the right vertical axis indicates the contents of the first element 306, the second element 308, and the third element 310. The right right vertical axis represents the relative relationship of the element content in each layer.

In the region A, the first dopant 302 (zinc) has the highest concentration, which is higher than $1 \times 10^{18}/cm^3$, and the concentration of the first dopant 302 decreases when the depth increases. More specifically, the zinc dopant has a first doping concentration in the region A and a second doping concentration in the region C. The second doping concentration is smaller than the first doping concentration. Moreover, the zinc dopant has a third doping concentration in the region E. The second doping concentration is between the first doping concentration and the third doping concentration. The zinc dopant has a fourth doping concentration in the region B, and the fourth doping concentration is between the first doping concentration and the second doping concentration. In some embodiments, a ratio of the first doping concentration to the second doping concentration is 10~100.

As shown in FIG. 5, the second dopant (silicon) has the highest doping concentration, which is about $1 \times 10^{18}/cm^3$. More specifically, the silicon dopant has a fifth doping concentration in the region G and a sixth doping concentration in the region F. The fifth doping concentration is higher than the sixth doping concentration. In some embodiments, a ratio of the fifth doping concentration to the sixth doping concentration is about 2~100.

As shown in FIG. 5, the first element 306 (indium) has the highest content in the region G, and the content of the first element 306 increases when the depth increases. More specifically, the region C, the region D, the region E and the region F substantially include the same content of indium (the first element 306), and ratios of the indium content in the region C, the region D, the region E and the region F to the indium content in the region A are all larger than 1000. Therefore, the region A can be defined as no indium, which means there is no intentional addition.

As shown in FIG. 5, the contents of the second element 308 (aluminum) in the region D and the region F are higher than that in the region E. The region D and the region F substantially include the same content of aluminum (the second element 308), and ratios of the aluminum content in the region D and the region F to the aluminum content in region A are larger than 1000. Therefore, the region A can be defined as no aluminum. Similarly, ratios of the aluminum content in the region D and the region F to the aluminum content in region G are larger than 1000, and the region G can be defined as no aluminum.

The third element 310 (gallium) has the highest content in the region A and the region B, and the gallium content in the region E is lower than the gallium contents in the region A and the region B. Besides, the gallium contents in the region D, the region F and the region G are very low compared to the gallium contents in the region A and the region B. More specifically, ratios of the gallium content in the region A to the gallium content in the region D, the region F and the region G are larger than 1000, and therefore the region D, the region F and the region G can be defined as no gallium.

Figure 6:
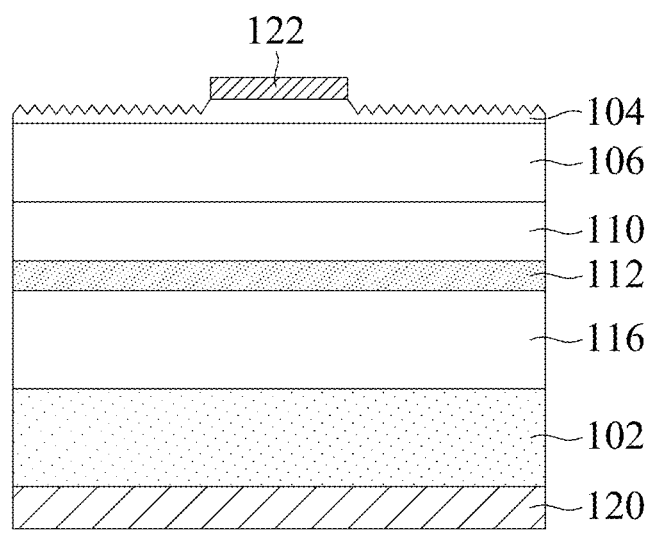
FIG. 6 shows a cross-sectional view of a semiconductor device in accordance with one embodiment of the present application.

FIG. 6 shows a cross-sectional view of a semiconductor device 300 in accordance with one embodiment of the present disclosure. For simplification, the same or similar reference numerals represent the same or similar structures. The formations and the materials of those structures are described above and omitted herein for brevity. In the embodiment, the semiconductor device 300 does not include the second type semiconductor structure 114, the second contact layer 118 and the buffer layer 108. Moreover, the semiconductor device 300 is double heterostructure (DH), and the material of the active structure 112 is quaternary compound semiconductor, such as InGaAsP. The material of the first contact layer 104 is binary compound semiconductor, such as GaAs. In one embodiment, the materials of the first window layer 106 and the second window layer 116 are the same, and they are different from the material of the first type semiconductor structure 110. For example, the materials of the first window layer 106 and the second window layer 116 include InP. Preferably, the materials of the first window layer 106 and the second window layer 116 are substantially consisting of InP. In other embodiment, the materials of the first contact layer 104 and the first window layer 106 are the same, such as GaAs, and they are different from the material of the second window layer 116 such as InP. Besides, the doping concentration of the dopant in the second window layer 116 of the semiconductor device 300 can be lower than $8 \times 10^{17}/cm^3$, preferably, between $1 \times 10^{16}/cm^3$ and $5 \times 10^{17}/cm^3$.

Figure 7:
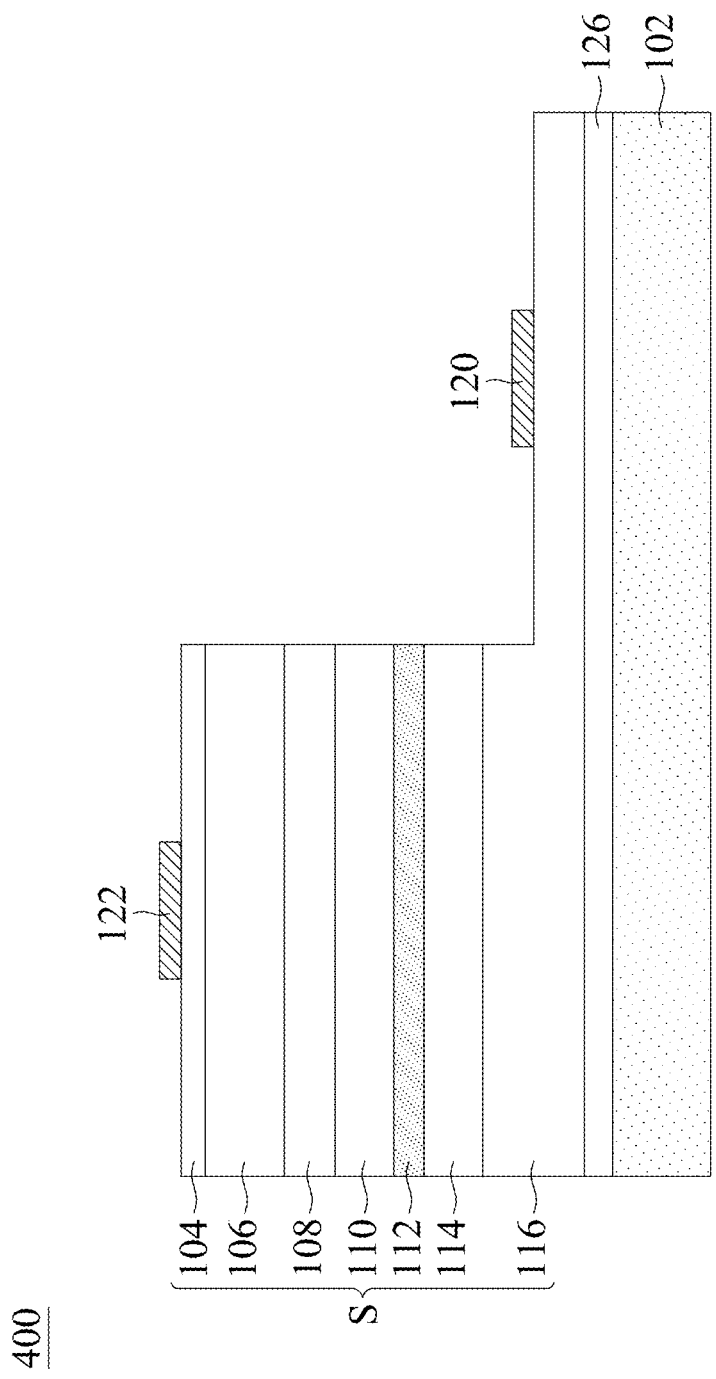
FIG. 7 shows a cross-sectional view of a semiconductor device in accordance with one embodiment of the present application.

FIG. 7 shows a cross-sectional view of a semiconductor device 400 in accordance with one embodiment of present disclosure. For simplification, the same or similar reference numerals represent the same or similar structures. The formations and the materials of those structures are described above and omitted herein for brevity. In the embodiment, the first electrode 122 and the second electrode 120 locate on the same side of the base 102 to form a horizontal type semiconductor device 400. In another embodiment, a connecting layer 126 is formed between the semiconductor stack S and the base 102, and the material of the connecting layer 126 can include insulating material. For example, the insulating material can include silicon oxide ($SiO_x$), aluminum oxide ($Al_2O_3$), aluminum nitride (AlN) or benzocyclobutene (BCB). In those embodiments, the base 102 can optionally have a material which is transparent to light emitted from the active structure 112, so the semiconductor device is able to emit light from the side the base 102 and the semiconductor device can be flipped and bonded to the circuit board by the first electrode 122 and the second electrode 120.

Figure 8:
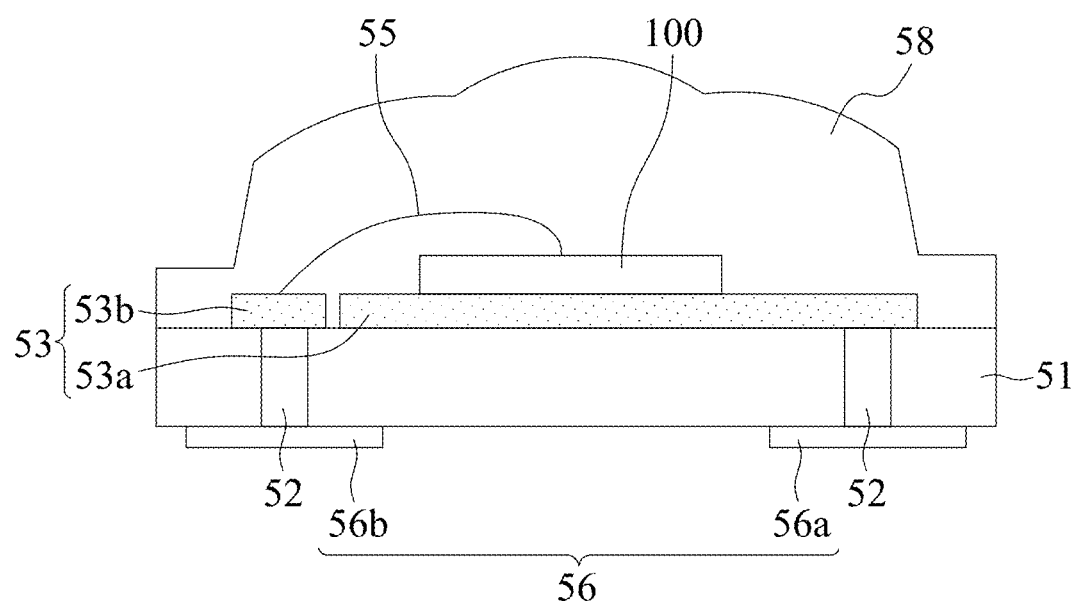
FIG. 8 shows a cross-sectional view of a package structure of a semiconductor device in accordance with one embodiment of the present application.

FIG. 8 shows a cross-sectional view of a package structure of a semiconductor device in accordance with one embodiment of present disclosure. Referring to FIG. 8, the package structure 500 includes the semiconductor device 100, a packaging mount 51, a carrier 53, a connecting line 55, a contact structure 56, and an encapsulating structure 58. The packaging mount 51 can include ceramic material or glass material. The packaging mount 51 has a plurality of through holes 52, which can be filled with electrically conductive material such as metal for facilitating electrical conduction or/and heat dissipation. dissipation. The carrier 53 is on a surface of a side of the packaging mount 51 and also includes electrically conductive material such as metal. The contact structure 56 is on a surface of the other side of the packaging mount 51. In the embodiment, the contact structure 56 includes contact pads 56a, 56b, which can form an electrical connection with the carrier 53 53 via the through holes 52. In one embodiment, the contact structure 56 can further include a thermal pad (not shown) between the contact pad 56a and the contact pad 56b. The semiconductor device 100 is on the carrier 53 and can be replaced by any semiconductor device shown in the embodiments of the present disclosure mentioned above. In the embodiment, the carrier 53 includes a first part 53a and a second part 53b, and the semiconductor device 100 can electrically connect to the second part 53b of the carrier 53 by the connecting line 55. In another embodiment, the semiconductor device 100 is disposed directly on the packaging mount 51 without the carrier 53 to electrically connect to the contact structure 56.

The material of the connecting line 55 can include metal, such as gold, silver, copper, aluminum or the alloy including at least one of the metals mentioned above. The encapsulating structure 58 covers the semiconductor device 100 to protect the semiconductor device 100. More specifically, the encapsulating structure 58 can include resin material, such as epoxy, or silicone. The encapsulating structure 58 can further includes a plurality of wavelength conversion particles (not shown) to convert a first light emitted by the semiconductor device 100 into a second light. The second light has a wavelength longer than that of the first light. In another embodiment, the semiconductor device 100 in the package structure 500 can be the semiconductor device 200 or the semiconductor device 300. In some embodiments, the package structure 500 includes a plurality of the semiconductor devices 100, 200 and/or 300, and the plurality of the semiconductor devices 100, 200 and/or 300 can be series connected, parallel connected or series-parallel connected with each other.

Some embodiments in the present disclosure provide a semiconductor device including one or multiple contact layer(s) and/or window layer(s) with a material having an absorption wavelength different from that of the active structure to prevent the light emitted by the active structure from absorbing by the contact layer(s) and/or the window layer(s). Therefore, the light-emitting efficiency of the semiconductor device can be improved, and step(s) of removing the contact layer(s) and/or the window layer(s) for keeping the brightness of the semiconductor device can be omitted. Besides, the contact layer(s) can be roughened to further improve the light-emitting efficiency.

Moreover, in according to the embodiments of the present disclosure, the buffer layer can be formed between the contact layer and the semiconductor structures to moderate the valence band energy difference and/or the conductive band energy difference. The buffer layer can prevent the saturated current of the semiconductor device from decreasing and the semiconductor device from failing ahead of time, therefore, the reliability of the semiconductor device can be improved.

The semiconductor device in the present disclosure can be applied in the field of illumination, display, communication, sensing, and power system, such as lamp, surveillance, mobile phone, tablet personal computer, vehicle instrument panel, television, sensor, computer, wearable device (such as watch, band, or necklace), traffic signs, or outdoor signage display.

It should be noted that the proposed various embodiments are for explanation but not for the purpose to limit the scope of the disclosure. Any possible modifications without departing from the spirit of the disclosure may be made and should be covered by the disclosure. The similar or same layer/structure or the layers/structures with the same reference numeral in different embodiments have identical chemical or physical characteristic. Besides, the elements shown in different embodiments mentioned above could be combined or replaced by one another in proper situation. The connecting relationship of specific layer/structure particularly described in one embodiment could also be applied in another embodiment, and the subject matter which comprises the layers/structures in different embodiments all fall within the scope of the following claims and their equivalents.

What is claimed is:

1. A semiconductor device comprising:
   a first type semiconductor structure comprising a first lattice constant, a first side and a second side opposite to the first side;
   an active structure on the first side and emitting a radiation having a peak wavelength between 1000 nm and 2000 nm; and
   a contact layer on the second side and comprising a second lattice constant,
   wherein a difference between the second lattice constant and the first lattice constant is at least 0.5%, and
   wherein the contact layer comprises a III-V group semiconductor material.

2. The semiconductor device of claim 1, wherein the active structure comprises III-V group semiconductor materials.

3. The semiconductor device of claim 2, wherein the first type semiconductor structure comprises a III-V group semiconductor material.

4. The semiconductor device of claim 1, further comprising a buffer layer between the contact layer and the first type semiconductor structure,
   wherein the buffer layer comprises a quaternary semiconductor compound.

5. The semiconductor device of claim 1, further comprising a buffer layer between the contact layer and the first type semiconductor structure,
   wherein the contact layer comprises a first dopant with a first doping concentration and the buffer layer comprises the first dopant with a second doping concentration, the active structure comprises the first dopant with a third doping concentration, and the second doping concentration is between the first doping concentration and the third doping concentration.

6. The semiconductor device of claim 1, further comprising:
   a buffer layer between the contact layer and the first type semiconductor structure; and
   a window layer between the contact layer and the buffer layer.

7. The semiconductor device of claim 6, wherein the window layer comprises the same material as or different from that of the contact layer.

8. The semiconductor device of claim 6, wherein the window layer has a third lattice constant and a difference between the first lattice constant and the third lattice constant is lower than 0.5%.

9. The semiconductor device of claim 6, wherein the window layer has a thickness thicker than that of the contact layer.

10. The semiconductor device of claim 1, wherein the contact layer has a surface with a roughing structure.

11. The semiconductor device of claim 1, wherein the contact layer has a band gap higher than that of the active structure.

12. The semiconductor device of claim 1, further comprising a base, a first electrode and a second electrode, wherein the first electrode and the second electrode are located on the same side of the base.

13. The semiconductor device of claim 1, further comprising a base, wherein the first type semiconductor structure is located between the contact layer and the base.

14. The semiconductor device of claim 13, further comprising a first electrode away from the base, and the contact layer directly contacts the first electrode.

15. A package structure comprising:
   a packaging mount;
   a semiconductor device of claim 1 on the packaging mount; and
   an encapsulating structure covering the semiconductor device.

16. The semiconductor device of claim 1, wherein the contact layer has a thickness less than that of the first type semiconductor structure.

17. The semiconductor device of claim 1, wherein the active structure comprises a first element and a second element different from the first element, and the contact layer does not comprise the first element and the second element.

18. The semiconductor device of claim 17, further comprising a base and a second type structure between the active structure and the base,
   wherein the first type semiconductor and the second type structure comprise the first element.

19. The semiconductor device of claim 17, wherein the contact layer comprises a dopant with a doping concentration between $2\times10^{18}/cm^3$ and $5\times10^{19}/cm^3$.

20. The semiconductor device of claim 1, wherein the contact layer has a thickness between 5 nm and 100 nm.

* * * * *